United States Patent [19]

Zeitlin et al.

[11] Patent Number: 4,803,310
[45] Date of Patent: Feb. 7, 1989

[54] SUPERCONDUCTORS HAVING CONTROLLED LAMINAR PINNING CENTERS, AND METHOD OF MANUFACTURING SAME

[75] Inventors: Bruce A. Zeitlin, Cheshire, Conn.; Michael S. Walker, Schenectady, N.Y.; Leszek R. Motowidlo, Southington, Conn.

[73] Assignee: Intermagnetics General Corporation, Guilderland, N.Y.

[21] Appl. No.: 45,386

[22] Filed: May 4, 1987

[51] Int. Cl.⁴ ............................................. H01B 12/00
[52] U.S. Cl. ................................ 174/128 S; 29/599; 174/125.1; 505/887
[58] Field of Search ..................... 174/126 S, 128 S; 29/599

[56] References Cited

U.S. PATENT DOCUMENTS

| | | | |
|---|---|---|---|
| 3,352,007 | 11/1967 | Charles | 29/599 |
| 3,366,728 | 1/1968 | Garwin et al. | 174/128 S |
| 3,370,347 | 2/1968 | Garwin et al. | 29/599 |
| 3,429,032 | 2/1969 | Martin et al. | 29/599 |
| 3,596,349 | 8/1971 | Boom | 174/128 S |
| 3,662,093 | 5/1972 | Wilson et al. | 174/128 S |
| 3,676,577 | 7/1972 | Martin et al. | 174/128 S X |
| 4,190,817 | 2/1980 | Rabinowitz | 29/599 X |
| 4,262,412 | 4/1981 | McDonald | 29/599 |
| 4,392,148 | 7/1983 | Chang et al. | 357/5 |
| 4,411,959 | 10/1983 | Braginski et al. | 174/128 S X |
| 4,490,439 | 12/1984 | Stekly et al. | 29/599 X |
| 4,575,927 | 3/1986 | Braginski et al. | 29/599 |
| 4,665,611 | 5/1987 | Sadakata et al. | 174/128 S X |

FOREIGN PATENT DOCUMENTS

2054392  5/1972  Fed. Rep. of Germany ........ 29/599

*Primary Examiner*—Morris H. Nimmo
*Attorney, Agent, or Firm*—Haynes N. Johnson

[57] ABSTRACT

A multifilament superconductor having continuous, non-random pinning centers and including a plurality of parallel superconductive subfilaments of uniform cross-sectional area, the subfilaments being embedded in generally hexagonal pinning jackets, and the pinning jackets together forming a structure having a honeycomb-like cross-section, the jackets having a wall thickness that is substantially an integral multiple of the coherence length of the subfilaments in a predetermined field, the jackets together forming a plurality of continuous paths for fluxoids across the superconductor, whereby total pinning density of said superconductor is substantially increased, and the critical field strength of the superconductor is enhanced.

24 Claims, 3 Drawing Sheets

SUPERCONDUCTORS HAVING CONTROLLED LAMINAR PINNING CENTERS, AND METHOD OF MANUFACTURING SAME

FIELD OF THE INVENTION

This invention relates to the field of superconductivity, in particular, to superconductors designed to have high critical current densities $J_c$ and critical fields $H_{c2}$ through controlled laminar pinning centers by means of mechanical metallurgy. The fluxoid pinning centers have predetermined spacing, are uniformly continuous, resulting in a superconductor that can carry increased critical current densities.

BACKGROUND OF THE INVENTION

Superconductivity is a condition existing within certain materials which, when cooled below a critical temperature $T_c$, have essentially zero resistance to the flow of current. This condition is maintained as long as the current does not exceed the critical current density $J_c$ and the magnetic field does not exceed the critical field $H_{c2}$. It is desirable to increase these critical limits in order to create more powerful electromagnets.

So far, critical current densities have been achieved of up to about 3500 A/mm² at about 5 Tesla. It is believed that $J_c$'s and $H_{c2}$'s can be enhanced considerably by use of our invention. In one example, a theoretical critical current density was predicted of about 20,000 A/mm² @5 Telsa if pinning centers are introduced by controlled and predetermined spacing having a laminar structure which continuously matches the flux line lattice.

Improvements in the critical current density have been achieved in the past through reduction in filament diameter, by selection of metals and alloys, and by use of pinning centers (defects). The latter, however, has not been done on a uniform and controlled basis.

Improvements in current density through conventional processing techniques have been accomplished, especially with niobium titanium, by random introduction of dislocations, grain boundaries, and use of alpha-titanium precipitates as pinning defects. The results have achieved current densities less than are theoretically predicted (6000 Amm$^{-2}$) if a linear summation model is assumed. See C. Meingest, NbTi Workshop, Madison, Wisc., Nov. 1986.

Our invention provides controlled, uniform, pinning centers with predetermined spacing which match the flux line lattice (FLL) continuously. This is accomplished by designing the superconductor filaments to form continuous pinning centers in layers (laminar pinning centers) with spacing being predetermined and related to the fluxoid lattices. The use of drawing and extrusion techniques combined with this design yields a practical superconductor.

Examples of drawing and extrusion techniques are given in Garwin et al. U.S. Pat. No. 3,370,347 and Braginski et al. U.S. Pat. No. 4,411,959. Examples of making flux traps (pinning centers) are found in Martin Et al. U.S. Pat. Nos. 3,429,032 and 3,676,577. Discussions of flux pinning will be found in Raffy and Renard, "Critical Currents and Pinning Effect in Superconducting Alloy Films Spatially Modulated in Concentration", Solid State Communications, Vol. 11, p. 1679 (1972); and Yetter, Kramer, and Ast, "Flux Pinning by Thin Chromium Layers", Jour. of Low Temperature Physics, Vol. 49, p. 227 (1982). However, the literature does not appear to suggest the creation of uniformly continuous pinning centers of predetermined spacing by mechanical metallurgy.

BRIEF SUMMARY OF THE INVENTION

Our invention involves the production of a core of superconductive subfilaments each held in a non-superconducting niobium jacket (the pinning shell). The totality of all the jackets provides pinning centers made up of multiple adjacent hexagons which have a honeycomb-like cross-section and which provide a series of continuous flux paths across the superconductor.

This invention deals with a superconductor having pinning centers (i.e., pinning jackets of predetermined volume adequate for the volume of flux to be pinned. The pinning centers are continuous (not random as, for example, when using precipitates) and run from one side of the superconductor to the other. The pinning centers are in the form of jackets (17, FIG. 3) surrounding each of a large number of minute subfilaments (15). The jacket has a honeycomb-like cross-section which provides a series of continuous flux paths across the superconductor.

The jackets are of a predetermined thickness relative to the diameter of the subfilaments. The objective in the dimensioning is to produce a pinning layer spacing comparable to the fluxoid spacing for the desired field strength, and to have the volume of the pinning layer shell approximate the volume of the fluxoids. Ideally, the structure would have a pinning thickness comparable to the coherence length §.

As used herein, 'coherence length' § refers to the term of art referring to depth of superconducting electrons at the boundary between normal and superconducting metal. At the boundary there is a region of length § where the proportion of superconducting electrons falls continuously from $(1-x)$ to zero.

The desired relative diameter of subfilaments and thickness of the pinning shell is determined by a calculation involving the strength of the applied field B and the coherence length for the materials being used, §. The pinning shell is formed of ductile metal, preferably a normal, not superconductive metal. Nb for example is a superconductor at very low fields. However, at fields of importance to this invention it is in the normal state. The metal used should be one that will not diffuse, or will diffuse only nominally, into the core filaments.

In use, for the normal case of applied magnetic field, the honey-comb like flux line lattice will intersect the subfilaments perpendicularly so that the fluxoids themselves will appear as transverse lines that distort around the subfilaments as the fluxoids thread their way, in a continuous path provided by the pinning material, across the composite lattice. Flux pinning will be maximized if the honey-comb like pinning spacing is identically the same as the fluxoid spacing. By choosing the appropriate dimensions of NbTi spacing and Nb spacing, and superimposing this controlled laminar pinning into the flux line lattice (See FIG. 3), the density $\sigma$ of pinning sites matching fluxoids is maximized and consequently the elementary pinning force $f_p$ is maximized.

The invention will be explained in terms of NbTi filaments and a jacket of Nb, though other materials can be used.

The Nb jackets are of a predetermined thickness relative to the diameter of the filaments. The relative diameter of NbTi core and "pinning shell" Nb is estimated by the applied field, B, and coherence length §(T). The pinning shell is formed of ductile metal, preferably a normal, not superconductive metal. Nb for example is a superconductor at very low fields. However, at fields of importance to this invention it is in the normal state. The metal used should be one that will not diffuse, or will diffuse only nominally, into the core filaments.

The superconductor is made by a process of successively drawing a group of jacketed NbTi filaments until the ratio of core size to pinning layer thickness is dimensioned as desired. The objective in the dimensioning is to produce a pinning layer spacing comparable to the fluxoid spacing for the desired field strength, and to have the volume of the pinning layer shell approximate the volume of the fluxoids. Ideally, the structure would have a pinning thickness comparable to the coherence length. In one example, a typical resulting NbTi subfilament would be 178 Angstroms in diameter and jacketed with pinning center material 40 Angstroms thick.

In use, for the normal case of applied magnetic field, the hexagonal flux line lattice will intersect the NbTi/Nb composite filaments perpendicularly so that the fluxoids themselves will appear as transverse lines that distort around the hexagonal composite elements as they thread their way, in a continuous path provided by the Nb pinning material, across the composite lattice. Flux pinning will be maximized if the hexagonal composite pinning spacing is identically the same as the fluxoid spacing.

DETAILED DESCRIPTION OF THE INVENTION

The Laminar Pinning Centers

Our invention involves the creation of a multi-filament superconductor having controlled, layered pinning centers. The spacing of the centers will be in the hundreds of Angstroms range and will be comparable to the spacing of the fluxoid field. By using layered spacing, achieved through drawing and extrusion techniques, the pinning centers will be uniform, will have predetermined dimensions, and will provide continuous flux paths across the superconductor.

The objective is to match the vortex lattice to the period of the composite structure; and this should be made to occur at the projected field of operation of the superconductor.

A substantially continuous laminar structure of pinning centers is provided by successively drawing and extruding strands of niobium-titanium (NbTi) having a jacket of niobium (Nb). This will result in a multi-filament wire of NbTi surrounded by pinning centers formed in the shape of a hexagonal structure of Nb. Creation of these pinning centers by mechanical metallurgy produces a structure in which the flux line lattice matches the normal pinning defects in a continous manner and results in a maximized bulk pinning force $F_p$. (For convenience, drawing and/or extruding will here be referred to as "drawing".)

The invention proposed here may be applied to any type of superconductor, such as NbTi and $Nb_3Sn$, and with any usual pinning center material. We use as an example Nb-46.5 w/o Ti because technically it is the most favorable and frequently applied alloy in the United States.

Theoretical Analysis

In theory, to stop the fluxoids moving and allow a current density to be sustained, the crystal lattice must supply an equal and opposite pinning force per unit volume $F_p$. That is, $$F_L = -F_p,$$

where $F_L$ is the Lorentz force. Thus increasing the pinning force $F_p$ will increase the critical current density $J_c$ so, $$J_c = F_p/B \qquad (1)$$

The pinning force $F_p$, and hence the $J_c$, is maximized by having uniform and continuous (as contrasted to random) pinning defects and by matching the fluxoid volume with the defect volume, that is, the flux line lattice (FLL) will match the pinning defects on a continuous basis; and the shape of the defect material should approximate that of the FLL. The hex-shaped pinning centers will be continuous across the superconductor and also longitudinally of the superconductor; and the volume of pinning centers in those portions of the jackets occupied by flux will equal the total volume of the flux (on a unit volume basis).

Thus, the fluxoids will have continuous pinning defect paths leading from one side of the multi-filament wire to the other. These paths will be through the continuous (contiguous) hexagonal jackets surrounding each subfilament of superconductive material.

The dimensioning of this proposed multi-filament wire with hexagonal pinning surfaces is done by first choosing operating magnetic field strength and then designing the multi-filament wire to that field strength. In practice the design is optimized for field strength of 5 or 8 tesla, but other strengths may also be the basis of design.

$J_c$ can be calculated, using equation (1), if the total pinning force $F_p$ is known. This latter parameter can be determined since it is the product of the density of pinning defects, $\rho$, and the elementary pinning force $f_p$:

$$F_p = \rho f_p \qquad (2)$$

This equation assumes direct summation.

These parameters can be calculated if certain assumptions are made:

1. That the flux line lattice is soft, that is, it can adjust to pinning defects by virtue of its plasticity, and that each pinning center exerts its maximum force. Experimental evidence shows that, as the applied field increases, the measurements approach direct summation calculations. See E. G. Collings, Applied Superconductivity Metallurgy and Physics of Titanium Alloys, Vol. 2, pages 48 and 49.

Figure 4:
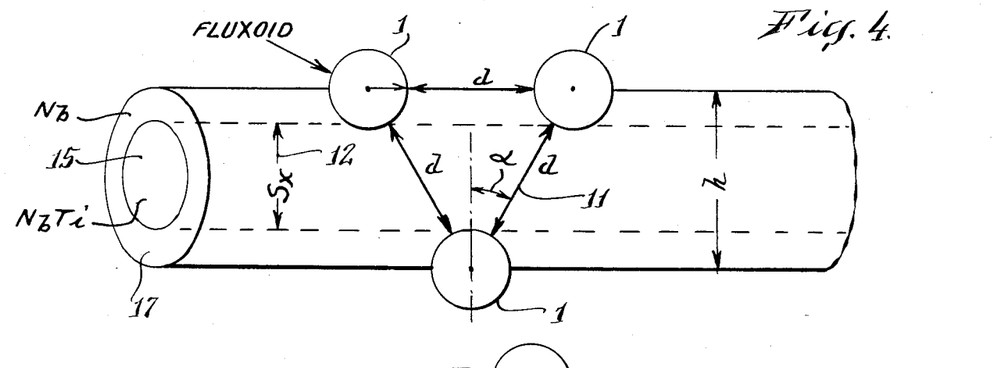
FIG. 4 is a plan view of a single triangular array of fluxoids as they relate to a single subfilament and its laminar pinning center. It shows the fluxoid array of FIG. 3.
Figure 5:
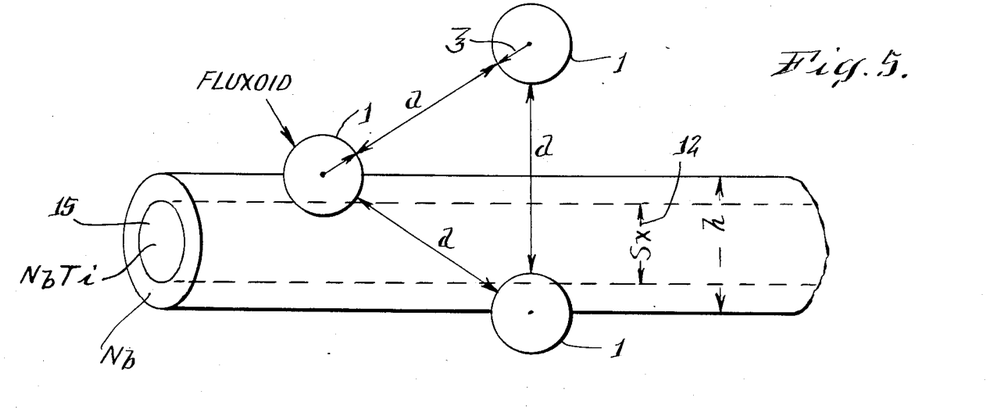
FIG. 5 is similar to FIG. 4, except the triangular array has been rotated 30°.

2. In the absence of pins, fluxoids arrange themselves in a triangular array (see FIG. 1). This triangular lattice is disclosed in David Fishlock, A Guide to Superconductivity, at FIG. 1.7 and pages 13 and 19. It is also found in C. Kittel, Introduction To Solid State Physics, page 387. The triangular array can take two orientations, as shown by FIGS. 4 and 5. The spacing d between adjacent fluxoids, for either orientation, is determined by the applied field H, as follows:

$$d = \left(\frac{2}{\sqrt{3}} \frac{\phi}{H}\right)^{\frac{1}{2}} \quad (3)$$

where $\phi$ is the flux quantum constant of $2.0678 \times 10^{-7}$ gauss-cm$^2$. This spacing d is discussed in E. G. Collings, supra, Vol. 1, page 505.

With a field of 5 Tesla and a flux constant of $2.06 \times 10^{-7}$ gauss-cm$^2$, d becomes 218 Angstroms.

3. The volume of pinning interaction is $$v = \pi [\S(T)]^2 \, l_{FL} \quad (4)$$

and the density $n_s$ of pinning defects is $$n_s = \frac{1}{l_{FL} h} \quad (5)$$

where $l_{FL}$ is the average length of one pin in the direction of the applied field, i.e., the average diameter of a bundle of NbTi composites (2 in FIG. 5); h is the spacing between centers of pinning defects in the x-direction; $\S(T)$ is the coherence length at temperature T. These assumptions as to the values of v and $n_s$ are believed to be unique to our invention.

4. By choosing appropriate dimensions of NbTi spacing and Nb spacing, and superimposing this controlled laminar structure into the flux line lattice (see FIG. 3), the density $\rho$ of pinning sites matching fluxoids is maximized and subsequently the elementary pinning force $f_p$ of one pin is maximized.

5. For the dimensions considered in practice designs, the proximity effect is not important. See Matsushita, T., Elementary Pinning Force of Normal Precipitates in a Superconductor, J. Appl. Phys. 54(1), page 281, January, 1983.

Structural Arrangement

By utilizing the above assumptions, it is possible to calculate the best dimensions of a controlled laminar superconductor in order to maximize $J_c$. Before going through a typical calculation, however, it is best to review the structures involved so that the calculations may be properly placed in context.

Figure 1:
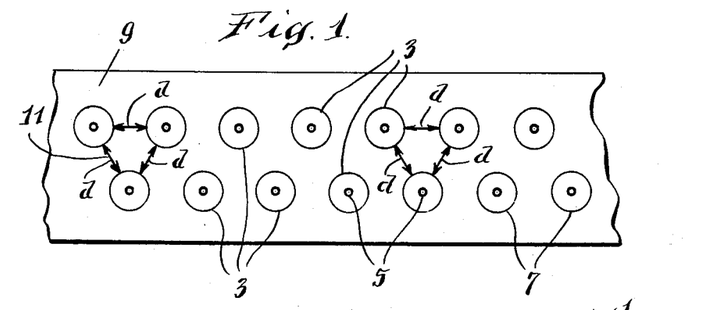
FIG. 1 is a schematic top view of Type II superconducting material showing the preferred arrangement of the flux line lattice.

FIG. 1 shows the penetration of flux line lattice or fluxoids 1 into a Type II superconductor in fields above $H_{c1}$, with the field passing into the page and forming the lattice 3. The dots 5 are the normal cores, and the circles 7 represent screening currents. The space between the fluxoids 1 is the superconducting region 9. The fluxoids 1 are in a triangular configuration and are spaced from one another by a distance d (indicated by the numeral 11; see also FIGS. 3 and 4).

Figure 2:
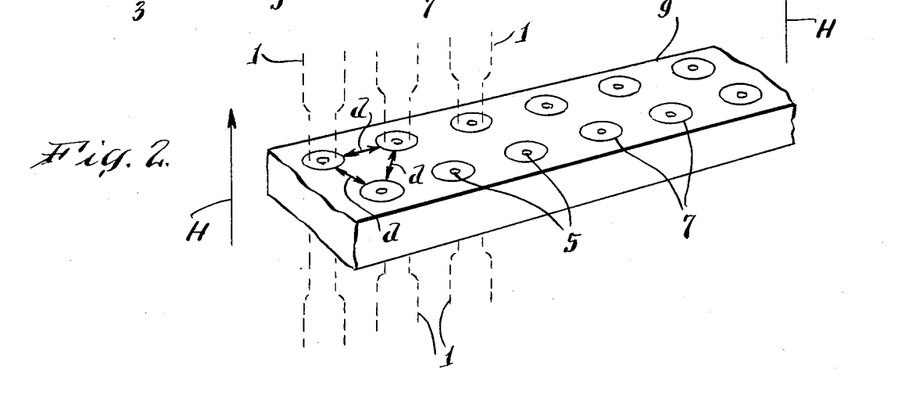
FIG. 2 is a schematic side view of the same.

A schematic side view of the lattice 3 of FIG. 1 is shown in FIG. 2, which also shows the direction of the field H.

Figure 3:
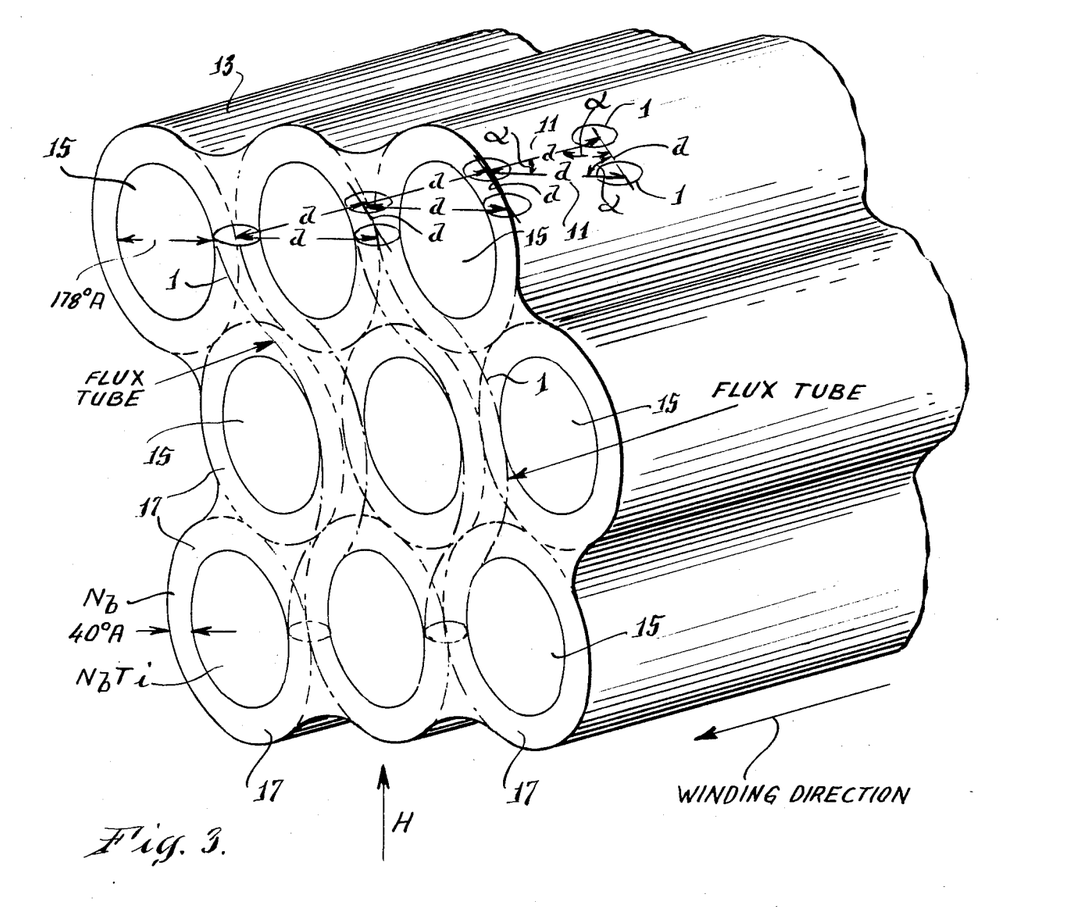
FIG. 3 is a partial perspective showing the relationship between the flux line lattice and the spacing and dimensioning of the pinning centers.

FIG. 3 shows a series of subfilaments 15 in a portion of a multi-filament wire 13 of NbTi 15 with their Nb shells or jackets 17. As can be seen, the subfilaments 15 are tightly packed and run parallel, and the jackets 17 form a hexagonal-shaped continuum of pinning centers with a honeycomb-like cross-section. The fluxoids 1 pass through the jackets 17. Their paths are not straight lines but, rather, the fluxoids flex sufficiently so that they remain in the jackets 17 and do not enter the filaments 15. This is in accordance with the first assumption, above, that the flux line lattice 3 is soft and can adjust to pinning defects.

As can be seen in FIG. 3, the fluxoids 1 are in a triangular configuration and are spaced from one another by a distance d (element 11). This is in accordance with the second assumption. The radius of the fluxoids is $\S(T)$, the coherence length; and shells 17 are also $\S(T)$ thick. Consequently, each fluxoid exactly fits the space between two subfilaments 15, i.e., the fluxoids have a diameter of 2 $\S(T)$, which is the same as the total thickness of two adjacent jackets 17.

FIG. 4 is an enlarged view showing only three fluxoids, in their triangular arrangement. They are spaced from one another by distance d. $S_x$ is the spacing 12 between the pinning defects or fluxoids 1 in the x-direction and is equal to the diameter of the NbTi subfilaments 15.

FIG. 5 is similar to FIG. 4, but shows the three fluxoids in an orientation rotated 30° from that of FIG. 4. $S_x$ again represents the spacing between the fluxoids in the x-direction, and the diameter of the subfilament 15, but is smaller than $S_x$ of FIG. 4.

Figure 6:
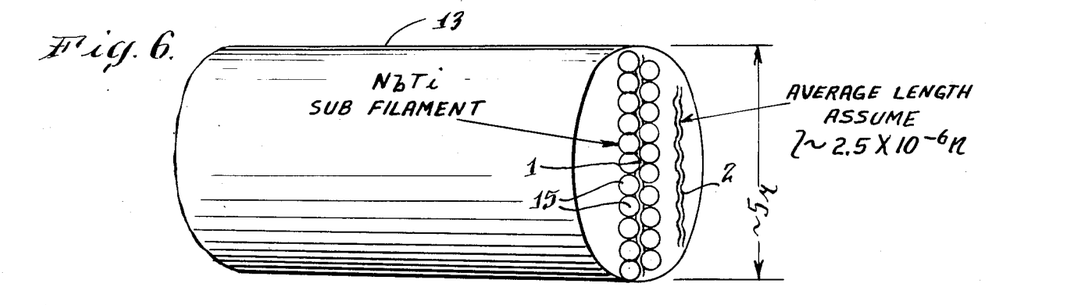
FIG. 6 is a perspective view of a portion of a filament containing subfilaments. It shows representative flux line paths.

FIG. 6 shows a multi-filament (composite) 13 and a fluxoid 1 passing through it from one side to the other, weaving between two lines of subfilaments 15. As shown, the average length of a flux line 2 is somewhat less than the diameter of multi-filament 13.

Calculation of the Potential Magnitude of Critical Current Density As Predicted by Our Invention We now return to the calculations, starting with a calculation for the configuration of FIG. 4.

Since, as shown in equation (1), $J_c$ is a function of the total bulk pinning force $F_p$, it is necessary to determine $F_p$ in order to calculate $J_c$. But, as set forth above in equation (2), $F_p$ is the product of the pinning density $\rho$ and the force per pin $f_p$.

For applied fields $B > H_{c1}$, the elementary pinning force $f_p$ is given as $$f_p = \frac{\frac{1}{2} \mu_o H_c^2 (1-h) V}{\xi(T)} \quad (6)$$

Matsushita, supra; Kramer, E. J., and Freyhardt, H. C., J. Appl. Phys. 51, 4903 (1980); Brandt, E. H., Vol 77A, no. 6, Phys. Letters, June 23, 1980; and C. Meingast, Nov., 1986, NbTi Workshop, Madison, Wisc.

In order to calculate, $f_p$, we must first determine $$H_c = \frac{H_c^2}{\sqrt{2}\ K_{GL}}$$

$$\xi(T) = .85(\xi_o l)^{\frac{1}{2}}[1 - T/T_c]^{-\frac{1}{2}}$$

These will be found in E. G. Collings, supra, Vols. 1 & 2

$$v = \pi[\S(T)]^2\ l\ FL$$

(see assumption 3) and $h = H/H_{c2}$ where H is the applied field.

For the case of Nb—46.5 w/o Ti alloy, the experimental parameters are taken:
  §o (BCS coherence length) = 300 Angstroms
  l (Electron mean free path) = 4.1 Angstroms
  $T_c$ (Critical Temperature) = 9.1° K.
  $H_{c2}$ (Critical Field) = 11 Tesla
  $K_{GL}$ (Ginsberg-Landau parameter) = 77.8
and will be found in E. G. Collings, supra, vols. 1 & 2.
Thus we obtain from above
  §(T) = 42.9 Angstroms
  $H_c = 0.1$ w/m$^2$
  h = 0.45, @5 Tesla
  $v = 1.45 \times 10^{-22}$ m$^3$ Substituting these calculated parameters into equation (6), we obtain for the special case of Nb—46.5 w/o Ti and applied field of 5 Tesla a calculated estimate for the elementary pinning force $$f_p 6.87 \times 10^{-11}\ nt$$

The effective pinning density $\rho$ is given by $$\left[\frac{B}{\phi} \cdot (2d)\right] \cdot n_s \quad (7)$$

where $\left[\frac{B}{\phi} \cdot 2d\right]$ is the fluxoid interaction cross section per unit volume (see Collings, supra, at p. 35), and $n_s$ is the defect density and is given in assumption 3.

In this example, the density $\rho$ is determined to be $$\rho = 1.45 \times 10^{21}/m^3$$

Since the pinning density and the elementary pinning force can now be calculated, the total bulk pinning force can be determined by use of equation (2) above. It is found to be $$F_p = 0.996 \times 10^{11}\ nt/m^3 = 99.6\ GN/m^3$$

$J_c$ can now be calculated by use of equation (1):

$$J_c = F_p/B$$

We find $$J_c = 1.99 \times 10^{10}\ amp/m^2$$

for a field of 5 Tesla.

The calculated value of, $J_c$, for the controlled laminar pinning centers may be compared to recent calculations presented at the NbTi workshop, Madison, Wisc., Nov., 1986. These are summarized in the table below.

| | Recent Optimized NbTi Wire (Conventional Approach) | Use of Controlled Laminar Pinning Centers for Our Invention |
|---|---|---|
| $J_c$ (calculated) current density | 6000 Amm$^{-2}$ | 20,000 Amm$^{-2}$ *(39,000 Amm$^{-2}$) |
| $J_c$ (measured) current density | 3000 Amm$^{-2}$ | — |

*If the defect spacing, h, decreases, then defect density, $n_s$, increases, and subsequently the current density goes up. See FIG. 5 for a schematic detail of fluxoid alignment when spacing decreases.

Note also that there are only two possible design configurations for a triangular FLL (FIGS. 4 and 5). These ultimately specify the defect spacing and are determined by the applied field and continuity requirements.

The results for the conventional approach were derived from Meingast, supra. All measurements and calculations were for a field of 5 Tesla.

Controlled laminar structure by means of mechanical metallurgy may increase the critical field $H_{c2}$ as well as $J_c$. Recent experimental evidence suggests that a substantial increase in $H_{c2}$ is possible if uniform controlled layering could be successfully introduced. Theoretically, the upper critical field scales as 1/l (mean free path). If one assumes that the mean free path, l, is affected by the thickness of layers, then the critical field should be proportional to the inverse of the laminar structure. Thus, as the thickness decreases, $H_{c2}$ increases. See B. Y. Jin, et al., J. Appl. Phys 5(7) Apr. 1, 1985; Y. J. Qian et al., Journal of Low Temp. Phys. vol. 49, nos. 3/4, 1982.

Using similar calculations for the orientation of FIG. 5 results in the following:

$$S_x = 69\ \text{Ang.} = 69 \times 10^{-10} m$$

$$h = 149\ \text{Ang.} = 149 \times 10^{-10} m$$

$$n_s = 1/l \cdot h = 1/(2.5 \times 10^{-6})\ (149 \times 10^{-10})$$

$$n_s = 2.68 \times 10^{13}/m^2$$

$$\rho = \frac{B}{\phi} \cdot (2d)\ n_s = 2.84 \times 10^{21}/m^3$$

$$F_p = \rho f_p = 1.95 \times 10^{11} \cdot nt/m^3$$

$$J_c = 39{,}000\ Amm^{-2}\ \text{at 5 Tesla}$$

Calculation of Desired Dimensions

Since d is known, equation (3), $s_x$ can be calculated. Knowing $s_x$ and §(T) enables one to specify the appropriate dimensions for a controlled laminar structure that best matches the flux line lattice. These turn out to be For the configuration of FIG. 4, the diameter of NbTi filament 15 ($s_x$) is 178 Angstroms, and the wall thickness of the niobium jacket 17 is 40 Angstroms at 5 Tesla.

For the configuration of FIG. 5, the diameter of NbTi filament 15 ($s_x$) is 69 Angstroms, and the wall thickness of the niobium jacket 17 is 14 Angstroms at 5 Tesla.

Use of Other Materials

In general, should we need to consider another material, we can do this simply by:
Specifying the material; and specifying the known experimental parameters of the chosen material.
$T_c$—critical temperature
§—BCS coherence length
l—mean free path
$Hc_2$—critical field
From these experimental values we can calculate
§(T)—material coherence length
This determines wall thickness of fluxoid pinning for the particular material.
We then specify the operating magnetic field:
B—applied field (experimental)
From this knowledge we can calculate the fluxoid spacing d $$d = \left( \frac{2\phi}{\sqrt{3} \, B} \right)^{\frac{1}{2}}$$

This determines the spacing between fluxoids and therefore specifies the final diameter of the filaments.

By use of the options set forth above and combining §(T) and B, we, therefore, specify the final design of our controlled laminar conductor no matter what materials are chosen. The material for the pinning centers need only be using pinning center material and need not be specified since only the dimension of the jackets need be known.

Manufacture

Figure 7A:
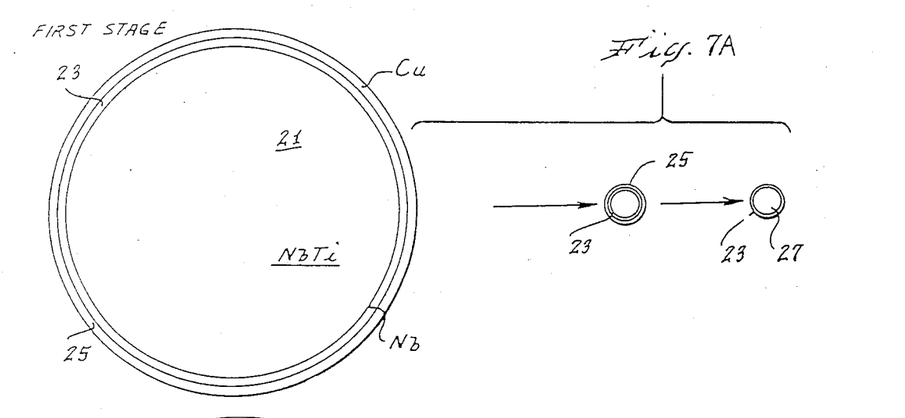
FIGS. 7A, 7B, and 7C are flow charts which, together, show the multiple drawing and extrusion steps used to produce the resulting multi-filament superconductor with its continuous, controlled, and uniform pinning centers. They show, respectively, the first, second, and third stages of manufacture.
Figure 7B:
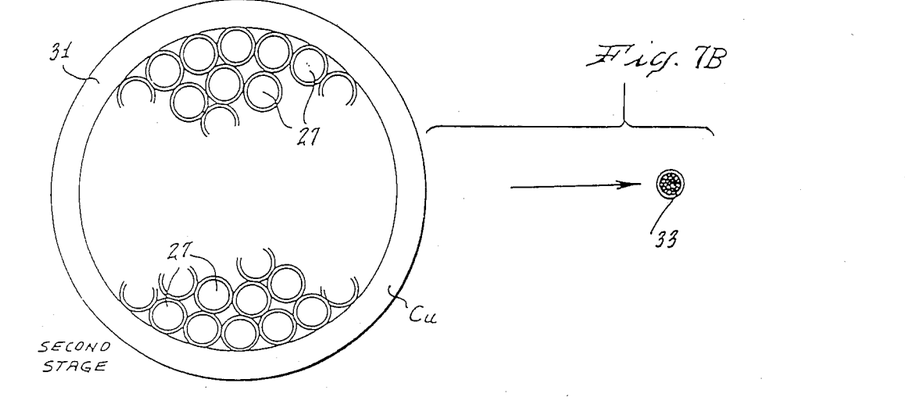
Figure 7C:
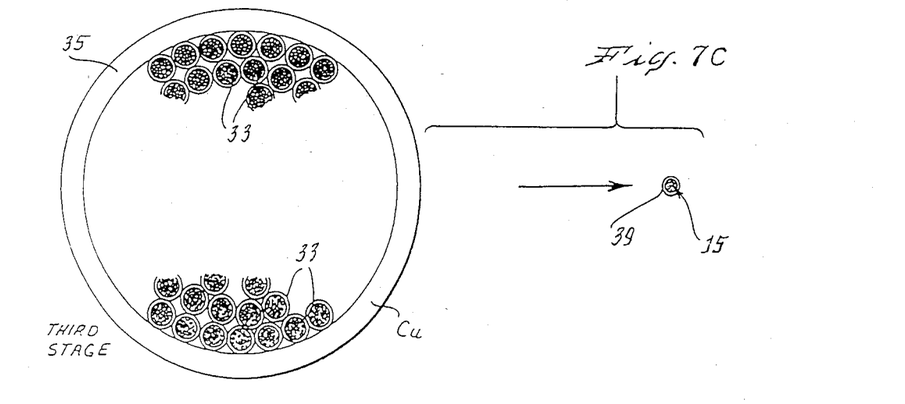

FIGS. 7A, 7B and 7C are flow charts showing the manufacture of a typical superconductor of our invention. In the example given, the subfilament is formed of niobium-46.5 w/o Ti alloy, and the layered pinning center is formed of niobium. The niobium barrier is about 50% of the cross-sectional area.

In this example we start with a 3.92" diameter NbTi rod 21 within a 0.85" thick Nb jacket 23 (FIG. 7A). This is placed within a 6.125" O.D. copper billet 25 and drawn until it has an outer diameter of 0.072". The copper is then stripped off, leaving a 0.066" diameter subfilament 27 formed of NbTi surrounded with a uniform layer of Nb.

In the second stage (FIG. 7B) approximately 5,800 of these subfilaments 27 are placed within a 6.125" O.D., 5.35" I.D. copper billet 31, and again drawn, this time to a copper-coated multi-filament 33 having a diameter of 0.072".

In the third stage (FIG. 7C) about 4,200 of the second stage multi-filaments 33 are placed within a 6.125" O.D., 5.625" I.D. copper billet 35, and this time drawn to a final wire 39 having a diameter of 0.008".

By use of the word "drawn," we refer to either drawing and/or extruding, whichever is preferable.

The result is a superconductor 39, containing approximately 4200 filaments each made up of 5800 subfilaments 15. Each subfilament is a conducting NbTi core with an approximate 178 Angstrom diameter and will be embedded in a surrounding pinning layer of Nb approximately 40 Angstroms thick. Due to the drawing process used to produce the multi-filament, the structure of the pinning material will hve a honeycomb-like cross-section formed of generally hexagonal cells. Each subfilament will be in its own cell, and the totality of the cells will create a series of generally continuous flux paths across the superconductor.

This drawing technique may result in various imperfections in the honeycomb structures such as discontinuities in the fluxoid paths. The paths will, nevertheless, be substantilly continuous and provide substantial improvement in $J_c$, even though $J_c$ will be less than that shown by our theory.

Other geometrics of fabrication may be used utilizing our concept. One alternative method, for example, would be to use the so-called "jellyroll" method to generate pinning centers with, for example, an NbTi core and a normal metal, such as Nb, for the laminate. This would create a series of flux paths through those portions of the laminate which run parallel, or substantially parallel, to the flux paths. There would, of course, be discontinuities in the pinning center material, and so the paths; but, nevertheless, this concept will create a certain amount of improved pinning.

The jellyroll method of producing superconductors involves producing the conductor by layering materials and rolling them up so that the cross-section of the conductor resembles that of a jellyroll. The word is known in the art as may be seen from McDonald U.S. Pat. No. 4,262,412 or an article entitled "Characterization of Vanadium Diffusion Barriers in Nb-Sn Wires", Smathers, O'Leary, and Sidab, Applied Superconductivity Conference, Baltimore, 1986.

Thus, by use of our method of fabrication by multiple extrusion technology, it is possible to create uniform and periodic layered pinning structures. The spacing of the layers can be adjusted to correlate with and be the same as, or multiples of, the coherence length of the filament core and the field.

We claim:

1. A superconductor formed of an array of subfilaments, said superconductor having enhanced $J_c$ for a predetermined field and substantially continuous, non-random pinning centers, said superconductor including
   a plurality of parallel superconductive subfilaments of uniform cross-sectional area, said subfilaments being embedded in pinning jackets to provide pinning density, and said pinning jackets together forming a unitary structure having a honeycomb-like cross-section, with said structure extending uniformly and substantially continuously from one side of said superconductor to the other,
   whereby a plurality of substantially continuous paths for fluxoids across said superconductor are provided, the total said pinning density of said superconductor is substantially increased, and the critical current of said superconductor is enhanced.

2. A superconductor as set forth in claim 1 in which there is a known coherence length at the boundary between said subfilaments and said pinning jackets for said predetermined field and in which said jackets have a wall thickness approximating the said coherence length of said subfilaments in said predetermined field and adjacent said jackets together providing a pinning thickness between said subfilaments of twice said coherence length.

3. A superconductor as set forth in claim 1 in which said subfilaments are made of NbTi.

4. A superconductor as set forth in claim 1 in which the total volume of said pinning jackets is sufficient to encompass the total volume of fluxoids passing through said superconductor for said predetermined field.

5. A superconductor having an enhanced critical current level for a predetermined field strength, said superconductor including a plurality of superconducting subfilaments of uniform cross-sectional area, said subfilaments being embedded in pinning centers, and said subfilaments being positioned relative to one another such that said pinning centers of contiguous said subfilaments define a uniform multiplicity of continuous paths across said plurality of said subfilaments, whereby the critical field of said superconductor is enhanced.

6. A superconductor as set forth in claim 5 in which the volume of said pinning centers is such that the total pinning forces per unit volume in said superconductor are sufficient to pin said fluxoids in said superconductor for a predetermined current level and said predetermined field.

7. A superconductor as set forth in claim 5 in which said multiplicity of paths have a honeycomb-like cross-section.

8. A superconductor as set forth in claim 5 in which said subfilaments are formed of NbTi, and said subfilaments are formed in a jellyroll configuration with adjacent layers of said subfilaments being separated by layers of normal metal.

9. A superconductor as set forth in claim 8 in which said pinning center paths are discontinuous at said layers of normal metal.

10. A superconductor having an enhanced critical current level for a predetermined field strength, said superconductor including a plurality of superconducting subfilaments of uniform cross-sectional area, said subfilaments being embedded in pinning centers, said pinning centers being uniformly spaced in a predetermined pattern and defining continuous paths across said superconductor, and said pinning centers having, for said predetermined field strength, a total volume (per unit length of said superconductor) in the paths of fluxoids substantially the same as or greater than the volume (per unit length of said superconductor) of fluxoids in said superconductor, whereby the critical field of said superconductor is enhanced.

11. A superconductor as set forth in claim 10 in which the volume of said pinning centers is such that the total pinning forces per unit volume in said superconductor are sufficient to pin said fluxoids in said superconductor for a predetermined current level and said predetermined field.

12. A multi-filament superconductor with enhanced $J_c$ and having non-random pinning centers, said superconductor being designed for a predetermined field strength and a triangular pattern of fluxoids running transversely of said superconductor, said superconductor including a plurality of parallel superconductor subfilaments made of a superconductive alloy, said superconductive alloy having a known coherence length, said subfilaments being embedded in a structure formed of pinning center material, said structure having a honeycomb-like cross section formed of cells surrounding individual said subfilaments, and said structure defining a plurality of continuous fluxoid paths running transversely to said subfilaments and across said superconductor.

13. A multi-filament superconductor having uniformly-spaced laminar pinning layers, said superconductor having a NbTi rod encased in a Nb jacket having a known coherence length and having a predetermined thickness relative to the diameter of said rod to produce a subfilament, encasing a plurality of said subfilaments in a billet and drawing said billet to produce a multi-filament, and encasing a plurality of said multi-filaments in a billet and drawing same sufficiently to create subfilaments encased within laminar pinning centers, said pinning centers being contiguous to one another, defining a continuous, generally honeycomb pattern, and having a thickness approximating the coherence length of said rod material, whereby said superconductor has an enhanced current.

14. The method of making a multi-filament superconductor having enhanced $J_c$ including the steps of forming a rod of superconductive material having a known coherence length, said rod having a predetermined diameter, encasing said rod in a jacket formed of normal metal, the thickness of said jacket bearing a predetermined ratio to the diameter of said rod, encasing said jacket in a billet and drawing said billet to form a subfilament, stripping the billet material from said subfilament to form a monofilament having a uniform surrounding layer of normal metal, encasing a plurality of said subfilaments in a second billet and drawing same to form a multi-filament, and encasing a plurality of said multi-filaments in a third billet and drawing same to form a multi-filament conductor having a plurality of subfilaments embedded in uniform laminar pinning centers formed of said normal metal and having a thickness approximating the coherence length of said superconductive rod material.

15. The method of making a multi-filament superconductor as set forth in claim 14 in which said rod is NbTi.

16. In a multi-filament superconductor having subfilaments of superconductive material in jackets of pinning center material with a known coherence length, that improvement in which said pinning center material jackets define a uniform cross-section of honeycomb configuration forming a plurality of continuous flux paths across said superconductor, and in which the fluxoid spacing has been determined on the basis of a triangular lattice and in which $$d = \left( \frac{2\phi}{\sqrt{3} \, H} \right)^{\frac{1}{2}}$$

where $\phi$ is the flux quantum constant of $2.0678 \times 10^{-7}$ gauss-cm$^2$, the subfilament diameter is $s_x$, and the jacket thickness is equal to the coherence length for the superconductor material of said subfilaments.

17. A superconductor formed of an array of subfilaments, said superconductor having enhanced $J_c$ for a predetermined field and substantially continuous, non-random pinning centers, said superconductor including a plurality of parallel superconductive subfilaments of uniform cross-sectional area, said subfilaments being embedded in generally hexagonal pinning jackets, and said pinning jackets together forming a structure having a honeycomb-like cross section, with said structure extending substantially continuously from one side of said superconductor to the other, said subfilaments being made of NbTi and said jackets being made of Nb, whereby a plurality of substantially continuous paths for fluxoids across said superconductor are provided, the total pinning density of said superconductor is substantially increased, and the critical current of said superconductor is enhanced.

18. A superconductor formed of an array of subfilaments, said superconductor having enhanced $J_c$ for a predetermined field of 5 Tesla and substantially continuous, non-random pinning centers, said superconductor including a plurality of parallel superconductive subfilaments of uniform cross-sectional area, said subfilaments being embedded in generally hexagonal pinning jackets, and said pinning jackets together forming a structure having a honeycomb-like cross section, with said structure extending substantially continuously from one side of said superconductor to the other, said subfilaments being made of NbTi and being about 178 Angstroms in diameter, whereby a plurality of substantially continuous paths for fluxoids across said superconductor are provided, the total pinning density of said superconductor is substantially increased, and the critical current of said superconductor is enhanced.

19. A superconductor as set forth in claim 18 in which said jackets are about 40 Angstroms thick.

20. A multi-filament superconductor with enhanced $J_c$ and having non-random pinning centers, said superconductor being designed for a predetermined field strength and an assumed triangular pattern of fluxoids running transversely of said superconductor, said superconductor including a plurality of parallel superconductor subfilaments made of a superconductive alloy, said superconductive alloy being Nb—46.5 w/o Ti, said subfilaments being embedded in a structure formed of pinning center material, said structure having a honeycomb-like cross section formed of generally hexagonal cells, said cells surrounding individual said subfilaments, the minimum distance between surfaces of adjacent said subfilaments being at least twice the coherence length of said superconductive alloy, the diameter of said subfilaments being based upon the assumption that said fluxoids form in a triangular lattice with sides d and d is determiend by the formula $$d = \left( \frac{2\phi}{\sqrt{3}\, H} \right)^{\frac{1}{2}}$$

said structure defining a plurality of fluxoid paths running transversely to said subfilaments and across said superconductor.

21. A superconductor formed of an array of subfilaments, said superconductor having enhanced $J_c$ for a predetermined field and substantially continuous, non-random pinning centers, said superconductor including a plurality of parallel superconductive subfilaments of uniform cross-sectional area, said subfilaments being embedded in pinning jackets to provide pinning density, and said pinning jackets together forming a unitary structure having a honeycomb-like cross section, with said structure extending uniformly and substantially continuously from one side of said superconductor to the other, the total volume of those of said pinning jackets positioned so as to recieve fluxoids being sufficient to encompass the total volume of said fluxoids passing through said superconductor for said predetermined field, said total volume of fluxoids having been determined as being in a triangular lattice and with the spacing of said fluxoids determined by the formula $$d = \left( \frac{2\phi}{\sqrt{3}\, H} \right)^{\frac{1}{2}}$$

where $\phi$ is the flux quantum constant of $2.0678 \times 10^{-7}$ gauss-cm$^2$ and H is said predetermined field, whereby a plurality of substantially continuous paths for fluxoids across said superconductor are provided, the total said pinning density of said superconductor is substantially increased, and the critical current of said superconductor is enhanced.

22. A multi-filament superconductor with enhanced $J_c$ and having non-random pinning centers, said superconductor being designed for a predetermined field strength and a triangular pattern of fluxoids running transversely of said superconductor, said superconductor including a plurality of parallel superconductor subfilaments made of a superconductive alloy, said superconductive alloy having a known coherence length, said subfilaments being embedded in a structure formed of pinning center material, the minimum distance between surfaces of adjacent said subfilaments being at least twice the coherence length of said superconductive alloy, the diameter of said subfilaments being calculated with said fluxoids formed in a triangular lattice with spacing d and d being determined by the formula $$d = \left( \frac{2\phi}{\sqrt{3}\, H} \right)^{\frac{1}{2}}$$

and said structure having a honeycomb-like cross section formed of cells surrounding individual said subfilaments, said structure defining a pluralityi of continuous fluxoid paths running transversely to said subfilaments and across said superconductor.

23. A multi-filament superconductor as set forth in claim 22 in which said minimum distance is twice said coherence length.

24. A multi-filament superconductor as set forth in claim 23 in which, for a said predetermined field of 5 tesla, the diameter of said subfilaments is about 178 Angstroms and said minimum distance is about 80 Angstroms.

* * * * *